US009633928B2

(12) United States Patent
Barowski et al.

(10) Patent No.: US 9,633,928 B2
(45) Date of Patent: Apr. 25, 2017

(54) THROUGH-SILICON VIA ACCESS DEVICE FOR INTEGRATED CIRCUITS

(71) Applicant: International Business Machines Corporation, Armonk, NY (US)

(72) Inventors: Harry Barowski, Boeblingen (DE); Joachim Keinert, Boeblingen (DE); Sridhar H. Rangarajan, Bangalore (IN); Haoxing Ren, Austin, TX (US); Sourav Saha, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/852,335

(22) Filed: Sep. 11, 2015

(65) Prior Publication Data

US 2016/0071786 A1 Mar. 10, 2016

Related U.S. Application Data

(63) Continuation of application No. 14/476,865, filed on Sep. 4, 2014, now Pat. No. 9,412,682.

(51) Int. Cl.
*H01L 25/00* (2006.01)
*H01L 23/48* (2006.01)
(Continued)

(52) U.S. Cl.
CPC ............ *H01L 23/481* (2013.01); *H01L 24/05* (2013.01); *H01L 25/0657* (2013.01);
(Continued)

(58) Field of Classification Search
CPC ........ H05K 1/112–1/113; H05K 1/115; H05K 3/4038
See application file for complete search history.

(56) References Cited

U.S. PATENT DOCUMENTS 8,421,500 B2 4/2013 Barowski et al.
8,476,112 B2 7/2013 Barowski et al.
(Continued)

FOREIGN PATENT DOCUMENTS

WO 2013062590 A1 5/2013

OTHER PUBLICATIONS

Hamdioui, "Yield Improvement and Test Cost Reduction for TSV Based 3D Stacked ICs", 2011 6th International Conference on Design & Technology of Integrated Systems in Nanoscale Era, Apr. 6-8, 2011, 1 page; DOI: 10.1109/DTIS.2011.5941404.
(Continued)

*Primary Examiner* — Jason M Crawford
(74) *Attorney, Agent, or Firm* — Scully, Scott, Murphy & Presser, P.C.

(57) ABSTRACT

A through-silicon via access device (TSVAD) for establishing an electrical connection to a through-silicon via (TSV) located in a planar stack of semiconductor chips is disclosed. The TSVAD may include a switching circuit, having a conductive pad terminal, a TSV terminal, an input terminal coupled to a sending logic circuit, an output terminal coupled to a receiving logic circuit, and logic devices to, in response to control signals, couple the TSV terminal to the conductive pad terminal, in one configuration, and couple the TSV terminal to another terminal in another configuration. The TSVAD may also include a control circuit to generate control signals to cause an input selection circuit to drive a signal from the sending logic circuit onto the input terminal, and to cause an output selection circuit to drive a logic signal from the output terminal to the receiving logic circuit.

6 Claims, 7 Drawing Sheets

(51) Int. Cl.
H01L 25/065 (2006.01)
H01L 23/00 (2006.01)
H01L 23/528 (2006.01)

(52) U.S. Cl.
CPC .......... *H01L 23/5283* (2013.01); *H01L 24/13* (2013.01); *H01L 24/16* (2013.01); *H01L 2224/0401* (2013.01); *H01L 2224/05567* (2013.01); *H01L 2224/13017* (2013.01); *H01L 2224/16146* (2013.01); *H01L 2224/16227* (2013.01); *H01L 2225/06541* (2013.01); *H01L 2225/06548* (2013.01); *H01L 2924/1426* (2013.01); *H01L 2924/1431* (2013.01)

(56) References Cited

U.S. PATENT DOCUMENTS

| | | | |
|---|---|---|---|
| 8,637,993 B2 | 1/2014 | Wong et al. | |
| 2011/0242869 A1* | 10/2011 | Lee | H01L 25/0657 365/51 |
| 2013/0049213 A1* | 2/2013 | Scheuermann | H01L 22/32 257/774 |
| 2013/0093091 A1* | 4/2013 | Ma | H01L 21/76898 257/751 |
| 2013/0093455 A1* | 4/2013 | Whetsel | G01R 31/318541 324/762.03 |
| 2013/0326294 A1* | 12/2013 | Lo | G11C 29/16 714/718 |
| 2014/0006864 A1* | 1/2014 | Menon | G11C 29/022 714/32 |
| 2014/0166461 A1* | 6/2014 | Goodnow | H01H 59/0009 200/600 |
| 2016/0071786 A1 | 3/2016 | Barowski et al. | |

OTHER PUBLICATIONS

Sakuma et al., "3D chip-stacking technology with through-silicon vias and low-volume leadfree interconnections," IBM DOI: 10,1147/JRD.2008.5388567.

List of IBM Patents or Patent Applications Treated as Related.

Office Action dated Jan. 6, 2016 received in a related U.S. Appl. No. 14/476,865.

* cited by examiner

THROUGH-SILICON VIA ACCESS DEVICE FOR INTEGRATED CIRCUITS

CROSS-REFERENCE TO RELATED APPLICATIONS

The present application claims priority of U.S. patent application Ser. No. 14/476,865 filed Sep. 4, 2014 the whole contents and disclosure of which are incorporated herein by reference.

BACKGROUND

The present disclosure generally relates to three-dimensional integrated circuit (IC) devices. In particular, this disclosure relates to a configurable electronic device to enable electrical access to a through-silicon via (TSV).

TSV may be a vertical electrical connection structure that may pass partially or completely through a semiconductor die. TSVs may be formed in a semiconductor die, for example, by using an etching process to create a hole through the die, depositing an insulating/lining material on the surface of the hole and surrounding semiconductor, and subsequently filling the hole with a conductive material, such as tungsten, copper or aluminum. The conductive material may be used to electrically connect circuits formed on one planar side of a first semiconductor die to circuits of a second semiconductor die, stacked against the other planar side of the first die.

A TSV may be useful in enabling stacking and electrical interconnection of multiple IC chips to create high-density circuit structures having relatively short interconnections, high performance, and high density. One such circuit structure, known as a stacked memory device, may include a plurality of memory chips vertically interconnected to each other, and to a die that includes logic functions. Stacked memory device logic functions may include management of memory operations such as reading, writing, maintenance, and interface with external components, such as a processor chip.

SUMMARY

Various aspects of the present disclosure may be useful for providing flexible and configurable electrical access to a through-silicon via (TSV) within a three-dimensional integrated circuit (3-D IC). A 3-D IC configured according to embodiments of the present disclosure may have, between a plurality of semiconductor chips, TSV connections that can be dynamically reconfigured to enable a variety of functional modes between the plurality of semiconductor chips.

Embodiments may be directed towards a through-silicon via access device (TSVAD) for use in establishing an electrical connection to a TSV located in a planar stack of semiconductor chips. The TSVAD may include a switching circuit, which may include a conductive pad terminal electrically coupled to a conductive pad located on a front face of a chip of the planar stack of semiconductor chips. The switching circuit may also include a TSV terminal electrically coupled to a TSV that extends to a back face of the chip, an input terminal electrically coupled to a sending logic circuit on the chip and an output terminal electrically coupled to a receiving logic circuit on the chip. The switching circuit may also include a plurality of logic devices configured to, in response to a plurality of control signals, couple the TSV terminal to the conductive pad terminal, in a first configuration, and couple the TSV terminal to at least one other terminal in a second configuration. The TSVAD may also include a control circuit configured to generate the plurality of control signals and an input selection circuit configured to selectively drive, in response to at least one control signal of the plurality of control signals, a signal from the sending logic circuit onto the input terminal. The TSVAD may also include an output selection circuit configured to selectively drive, in response to at least one control signal of the plurality of control signals, a logic signal from the output terminal to the receiving logic circuit.

Embodiments may also be directed towards a system for establishing an electrical interconnection between at least two semiconductor chips located in a planar stack of semiconductor chips. The system may include a first chip having a first TSVAD coupled to a logic circuit and to a TSV on the first chip and a second chip having a second TSVAD coupled to a logic circuit and to a conductive pad, on the second chip, that is electrically coupled to the TSV of the first chip.

Embodiments may also be directed towards method of operating TSVADs to establish an electrical interconnection between at least two semiconductor chips located in a planar stack of semiconductor chips. The method may include initializing a set of control parameters used by a control circuit, loading the initialized set of control parameters into a state machine and generating, in response to the initialized set of control parameters, a set of control signals. The method may also include controlling, using the set of control signals, logical devices to establish a first electrical interconnection that includes a first TSV and a first conductive pad, between at least two TSVADs in the at least two semiconductor chips, and changing, in response to a change of the control parameters, a state of the state machine. The method may also include generating, in response to the changed state of the state machine, and modified set of control signals and modifying, using the modified set of control signals, the electrical interconnection between the at least two TSVADs in the at least two semiconductor chips.

Aspects of the various embodiments may be used to enable a variety of functions of a 3-D IC and allow repair actions for defective TSV connections within a 3-D IC. Aspects of the various embodiments may also be useful for providing cost-effective TSV access devices for use with 3-D ICs, by using existing and proven logic design, integration and integrated circuit (IC) manufacturing technologies.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
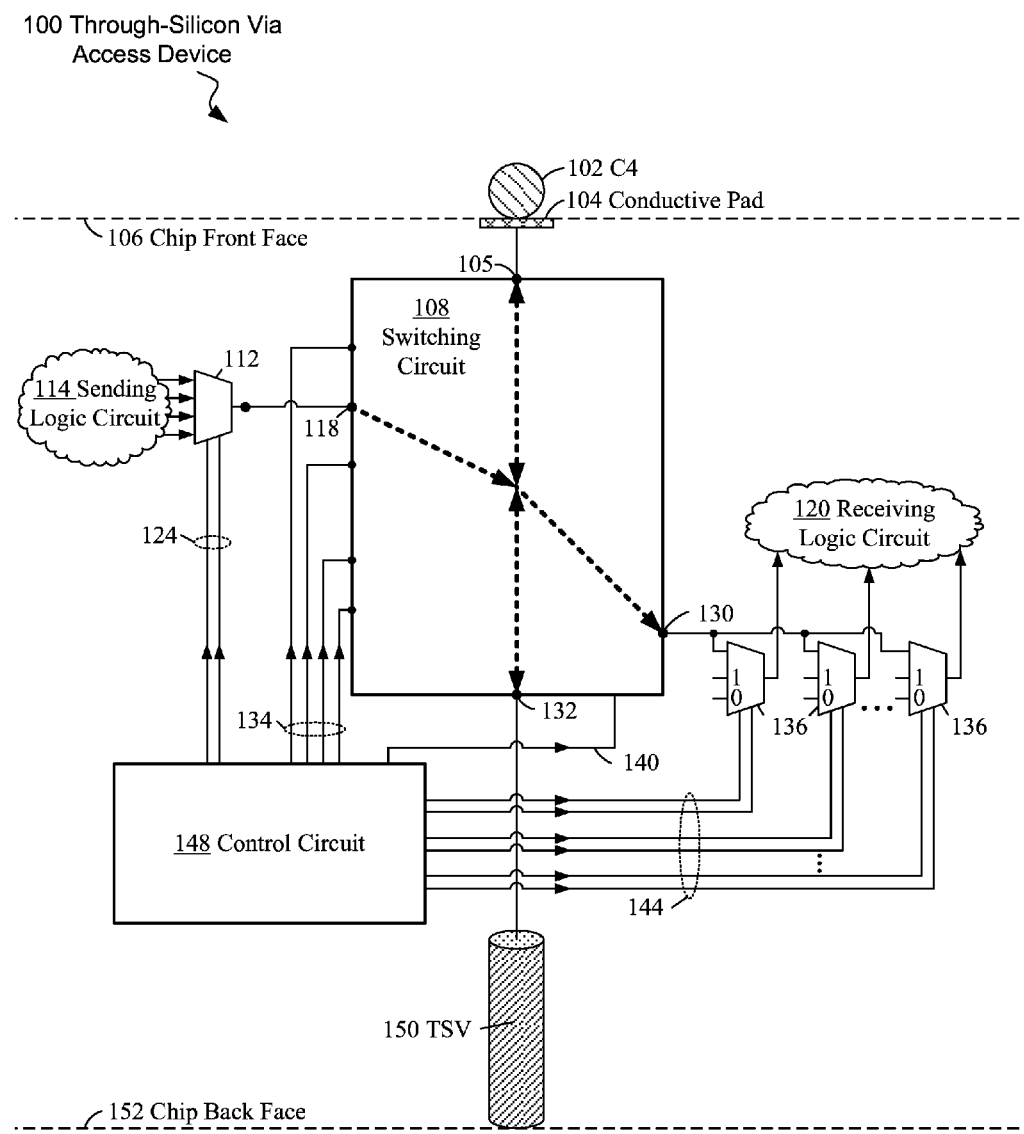
FIG. 1 is a block diagram of a through-silicon via access device (TSVAD), including a switching circuit and a control circuit, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of an electronic device to provide access to a through-silicon via (TSV) used to interconnect at least two chips of a 3-dimensional integrated circuit (3-D IC), corresponding to an initial design configuration of the 3-D IC. The 3-D IC may have an initial design configuration specified for a particular application that the 3-D IC may perform for a significant portion of its operating life. For example, the particular application may be as a sensor array chip coupled to an image processing chip, or as a processor chip coupled to a plurality of memory chips. While not necessarily limited thereto, embodiments discussed in this context can facilitate an understanding of various aspects of the disclosure. Certain embodiments may also be directed towards other applications, such as providing access to a TSV corresponding to an alternate configuration of the 3-D IC, such as may be used during a debug or bringup mode, in order to allow circuits within the 3-D IC to be monitored and/or altered, in order to verify their operation. Such modes may be useful in testing, diagnosing and monitoring performance of, a 3-D IC. Embodiments may also be directed towards reconfiguring a 3-D IC to alter its architecture or performance characteristics for various applications, which may include, but are not limited to, changing signal bus widths, rerouting control signals, and altering other connections between two or more chips within the 3-D IC. Embodiments may also be directed towards repair operations within the 3-D IC which may include routing signals to bypass non-functional TSVs.

For ease of discussion, the term "tri-state driver" is used herein, however, it is understood that in various embodiments a tri-state driver circuit may also be useful as a receiver circuit.

3-D ICs, which may include a planar stack of electrically and physically interconnected semiconductor chips, may be used in a variety of types of electronic equipment and devices where high-density, high-performance circuitry is useful. Applications for 3-D ICs may include portable electronic devices such as cell phones, digital cameras and personal digital assistants (PDAs), as well as integrated assemblies of memory chips and hybrid processor/memory devices.

TSVs may be structures useful for electrically interconnecting two or more semiconductor chips within a 3-D IC. TSVs may be relatively costly in terms of semiconductor chip area they consume (relative to active circuits and routing they may displace), and may have reliability challenges, so the number of TSVs used in a 3-D IC may be limited.

Electrical connections, between chips of a 3-D IC, that are primarily determined by the placement of electrical conductors connecting TSVs to logical circuits ("hardwired") may offer limited 3-D IC design flexibility, with respect to diagnostic, test, reconfiguration and prototyping operations. Where feasible, the repair and/or rework of 3-D IC electrical connections having limited flexibility may costly and time-consuming, and may require procedures that may risk damaging one or more of the semiconductor chips of the 3-D IC. In cases where repair/rework operations are not feasible, and connection reconfiguration is required, a costly redesign and/or re-fabrication of one or more of the 3-D IC chips may be necessary to meet 3-D IC design objectives.

Various embodiments of the present disclosure relate to a TSVAD configured to be designed into one or more semiconductor chips of a 3-D IC. The TSVAD may be useful for providing flexible, dynamically reconfigurable interconnect between a TSV, a conductive pad, a selected output of a logic device and one or more selected inputs to logic devices. A robust 3-D IC design, with multiple operational modes such as test, diagnostic, bring-up, repair and one or more functional modes may result from the use of a set of TSVADs within a 3-D IC design.

A TSVAD may help limit repair and rework time and costs for a 3-D IC by providing the ability to establish functional electrical connections in place of faulty TSV connections. Use of TSVADs within a 3-D IC design may allow a variety of connection types between semiconductor chips, including, but not limited to, bidirectional, multi-drop, tri-state, variable drive strength and pass-through. Use of TSVADs within a 3-D IC design may allow control of chip-to-chip interconnections through the use of software, hardware connections, scannable registers or a logic state on one or more chips.

A 3-D IC designed according to certain embodiments may be compatible with existing and proven semiconductor chips, electronic chip packaging and other electronic systems, and may be a useful and cost-effective way to provide reconfigurable interconnect structures for chips within a 3-D IC. A 3-D IC constructed according to embodiments of the present disclosure may be used in an existing electronic assembly or system.

During manufacturing, prototyping, bring-up and testing phases of a 3-D IC, it may be discovered that certain electrical connections between semiconductor chips within the 3-D IC are either defective or need to be altered in order to meet device design goals. Altering connections, which may involve TSVs, between semiconductor chips within a 3-D IC may be time-consuming, costly, and may include rework operations that are delicate and which may result in the destruction of semiconductor chips and/or structures used to interconnect them.

According to embodiments, a TSVAD may allow connections involving TSVs, between semiconductor chips of a 3-D IC, to be electrically reconfigurable, without physical alteration, rework of, or risk of damage to, semiconductor chips and associated interconnect structures. A TSVAD may be used to establish reconfigurable connections between a TSV, a conductive pad (which may be used with a C4), an output from a logic circuit and multiple inputs to logic circuits, within a semiconductor chip. In certain embodiments, multiple TSVADs, located on different semiconductor chips, may be used together to provide relatively fast, inexpensive, risk-free management of interconnections between multiple semiconductor chips of a 3-D IC. Chip interconnection management may be accomplished through a variety of control mechanisms which may be integrated into existing semiconductor chip and system designs, Certain embodiments relate to a configurable electronic device to provide electrical access to TSVs within a 3-D IC. FIG. 1 depicts a block diagram of a TSVAD 100, within a chip of a planar stack of semiconductor chips (3-D IC). The TSVAD may include a switching circuit 108, a control circuit 148, input selection multiplexer (MUX) circuit 112 and output selection circuit (MUXs) 136, according to embodiments of the present disclosure. In embodiments, the TSVAD 100 may be useful for establishing an electrical connection (signal path) between TSV 150 and one or more of conductive pad 104, sending logic circuit 114 and receiving logic circuit 120.

Switching circuit 108, in response to control signals 134 and control signal 140, may be used to create a variety of different signal paths between terminals 105, 118, 132 and 130, which may be useful for establishing signal paths between two or more chips of a 3-D IC. Conductive pad terminal 105 may be connected to conductive pad 104, which may be located on or adjacent to the chip front face 106. TSV 150 may extend from a back face 152 of the semiconductor chip.

In certain embodiments, signal paths established by switching circuit 108 may be useful for transmitting logical signals from a first chip to a second chip, for example, through at least one of TSV 150 and conductive pad 104, connected to the TSV terminal 132 and conductive pad terminal 105, respectively. In certain embodiments, established signal paths may include a path from input terminal 118 to at least one of conductive pad terminal 105, TSV terminal 132 and output terminal 130. In certain embodiments, established signal paths may include output terminal 130 logically connected to at least one of conductive pad terminal 105, input terminal 118 and TSV terminal 132. Output terminal 130 may be used to output signals to at least one output selection MUX 136, which may drive them to receiving logic circuit 120.

In certain embodiments, the TSVAD 100 may include an input selection circuit, e.g., a multiplexer (MUX) 112, configured to be controlled by a control circuit 148, through control inputs 124. The MUX may have a plurality of inputs coupled to a sending logic circuit 114 and an output coupled to an input terminal 118 of the switching circuit 108. In embodiments, sending logic circuit 114 and receiving logic circuit 120 may each include logical blocks or functions that are part of a processor or state machine, for example. The input selection circuit (MUX) 112 may be configured to selectively drive, in response to at least one control signal 124, a single signal output from the sending logic circuit 114 onto the input terminal 118 of switching circuit 108. Switching circuit 108, in response to control inputs 134, 140 from control circuit 148, may selectively drive the signal received at input terminal 118 to one or more of the terminals 105, 132, 130 of switching circuit 108.

The TSVAD may include an output selection circuit, e.g., one or more MUXs 136, configured to be controlled by inputs 144 from the control circuit 148. The MUXs 136 may have at least one input coupled to an output terminal 130 of switching circuit 108, at least one other input coupled to a fixed logic value (e.g., "0" or "1"), and an output coupled to a receiving logic circuit 120. The output selection circuit (MUXs) 136 may receive a signal present on output terminal 130 of switching circuit 108, and be configured to selectively drive, in response to at least one control input 144, the signal to one or more inputs of the receiving logic circuit 120. Certain MUXs 136 may be controlled, in response to control signals 144, to drive a logical "0" or a "1" value to certain inputs of receiving logic circuit 120, which may be useful for setting inputs of receiving logic circuit 122 appropriate values when they are not being driven by a signal on output terminal 130.

Sending logic circuit 114 and receiving logic circuit 120 are depicted in FIG. 1 as separate logical functions; in certain embodiments, sending logic circuit 114 and receiving logic circuit 120 may be incorporated into one logical block or function.

Figure 2:
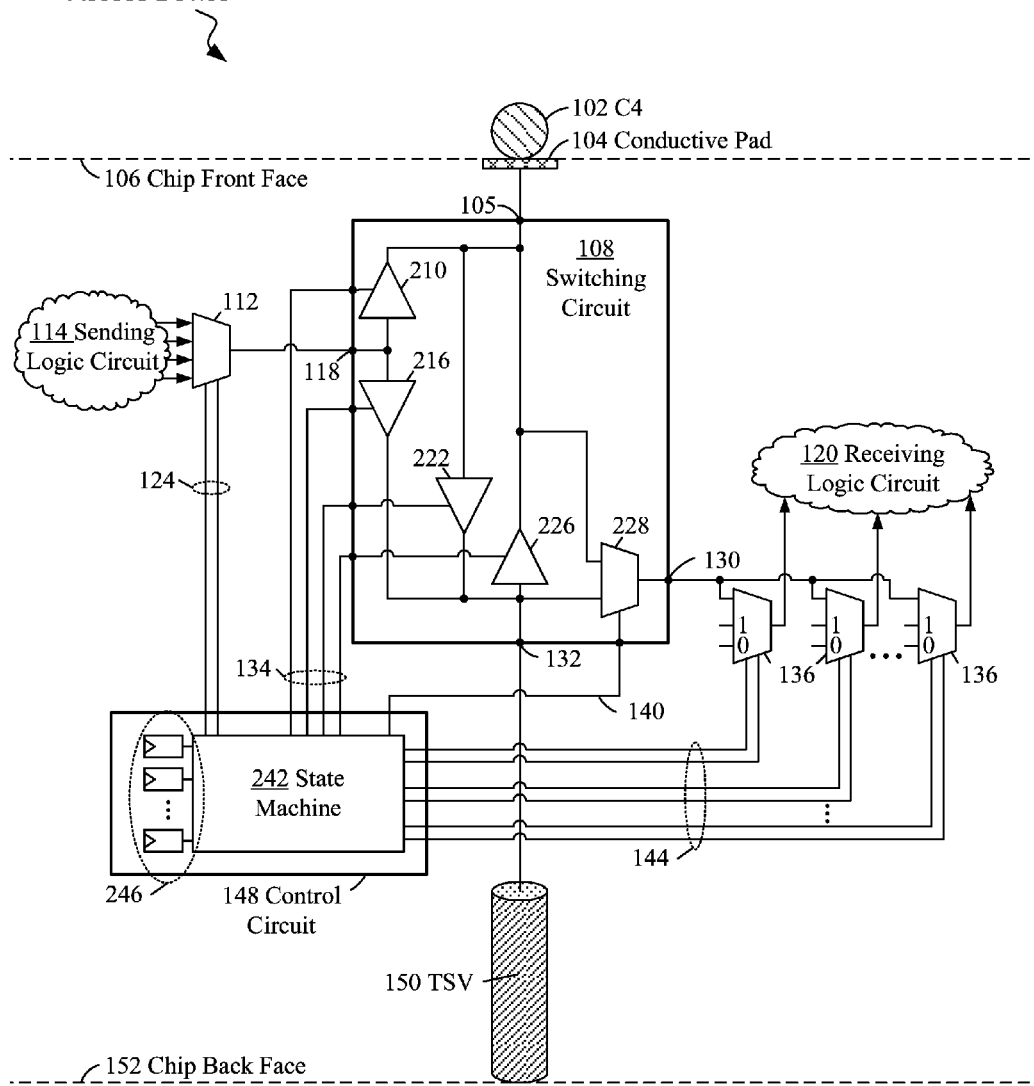
FIG. 2 is a block diagram of a TSVAD, including a switching circuit having logic devices and a control circuit having a state machine, according to embodiments.

FIG. 2 is a block diagram of a TSVAD 200, including a switching circuit 108 and a control circuit 148, input selection MUX 112 and output selection MUXs 136, according to embodiments consistent with FIG. 1.

Control circuit 148 may include a state machine 242 and configuration latches 246. State machine 242 may be configured to generate a set of control signals 124, 134, 140 and 144 in response to a logical state of the state machine and configuration data accessible by the state machine. Configuration data may be held in at least one configuration latch 246 which may be coupled to the state machine. Configuration latches 246 may be useful for providing state machine 242 with an initial or changed configuration state, which may be used to determine one or more values of control signals 124, 134, 140 and 144.

In embodiments, control signals 124 may be used for controlling input selection MUX 112, to select one input, to be driven onto input terminal 118, from a plurality of inputs from sending logic circuit 114. In certain embodiments, tri-state control signals 134 may be used for selectively enabling and disabling tri-state drivers 210, 216, 222 and 226. In certain embodiments, controlled collapse chip connection (C4)/TSV selection MUX control signal 140 may be used for selectively driving a logical value present on either conductive pad terminal 105 or TSV terminal 132 onto output terminal 130. In embodiments, output selection MUX control signals 144 may be used for controlling MUXs 136 to selectively drive a signal present on output terminal 130, or a logical value into each input of receiving logic circuit 120.

Switching circuit 108 may be useful for establishing a variety of logical connections between TSV 150, conductive pad 104, sending logic circuit 114 and receiving logic circuit 120. Switching circuit 108 may include a plurality of logic devices (e.g., tri-state drivers and MUXs) configured to, in response to the set of control signals generated by state machine 242, couple the TSV terminal 132 to the conductive pad terminal 105, in a first configuration, and couple the TSV terminal 132 to at least one other terminal (e.g., 118, 130) in a second configuration.

In certain embodiments, switching circuit 108 may include a tri-state driver 210 configured to drive, in response to a signal on input terminal 118 and a control signal 134, an output coupled to the conductive pad terminal 105 of the switching circuit 108. Tri-state driver 210 may be useful for driving a signal having a selected logic value from sending logic circuit 114 to a C4 102 (connected to the conductive pad 104) which may be electrically connected to a second chip within the 3-D IC. In embodiments, the second chip may include a TSVAD configured to receive the driven signal.

In certain embodiments, switching circuit 108 may include a tri-state driver 216 configured to drive, in response to a signal on input terminal 118 and a control signal 134, an output coupled to the TSV terminal 132 of the switching circuit 108. Tri-state driver 216 may be useful for driving a signal having a selected logic value from sending logic circuit 114 to a TSV 150 which may be electrically connected to a second chip within the 3-D IC. In embodiments, the second chip may include a TSVAD configured to receive the driven signal.

In certain embodiments, switching circuit 108 may include a tri-state driver 222 configured to drive, in response to a signal on conductive pad terminal 105 and a control signal 134, an output coupled to the TSV terminal 132 of the switching circuit 108. Tri-state driver 222 may be useful for driving a signal received from a second chip electrically connected to conductive pad 104 to a TSV 150 which may be electrically connected to a third chip within the 3-D IC. In embodiments, the second chip may include a TSVAD configured to drive the driven signal, and the third chip may include a TSVAD configured to receive the driven signal. In certain embodiments, tri-state driver 222 may be useful in passing a signal through one or more chips located between a chip driving the signal and a chip receiving the signal.

In certain embodiments, switching circuit 108 may include a tri-state driver 226 configured to drive, in response to a signal on the TSV terminal 132 and a control signal 134, an output coupled to conductive pad terminal 105 of the switching circuit 108. Tri-state driver 226 may be useful for driving a signal received from a second chip electrically connected to TSV terminal 132 to a C4 102, which may be electrically connected to a third chip within the 3-D IC. In embodiments, the second chip may include a TSVAD configured to drive the driven signal, and the third chip may include a TSVAD configured to receive the driven signal. In certain embodiments, tri-state driver 226 may be useful in passing a signal through one or more chips located between a chip driving the signal and a chip receiving the signal.

In certain embodiments, switching circuit 108 may include a MUX 228 configured to selectively drive, in response to a control signal 140, onto the output terminal 130 of the switching circuit 108, one of a signal on the TSV terminal 132 and a signal on conductive pad terminal 104. Selecting a signal from the conductive pad terminal 104 or the TSV terminal 132 may be useful in providing a flexible, configurable interface between various chips within the 3-D IC and receiving logic circuit 120.

In certain embodiments, the electrical interconnection between at least two TSVADs in at least two semiconductor chips within the 3-D IC may include changing a signal propagation direction between the TSVAD of a first chip and the TSVAD of a second chip. A bidirectional signaling interface may be useful for making efficient use of data and control signal transfer paths (including TSVs and C4s) between two chips within a 3-D IC, by allowing both chips to alternately send and receive data on the same signal path.

For example, in one configuration, one driver (e.g., 222) of tri-state drivers 222 and 226 may be enabled to function as a driver in the TSVAD of a first chip and the other driver (e.g., 226) may be enabled and interconnected to function as a receiver in the TSVAD of a second chip, in order to form a driver/receiver pair to propagate a signal from the first chip to the second chip. In a second configuration, driver 226 may be enabled to function as a driver in the TSVAD of the first chip and driver 222 may be enabled and interconnected to function as a receiver in the TSVAD of the second chip, in order to reverse the signal propagation direction from the second chip to the first chip. A similar bidirectional signaling interface may be configured by appropriately enabling, disabling, and interconnecting, through TSVs and C4s, tri-state drivers 210 and 216 on two or more electrically interconnected chips within a 3-D IC.

State machine 242 may be designed to enable combinations of the configurations described above, and in embodiments may be designed to enable only one tri-state driver to drive a particular terminal (e.g., conductive pad terminal 104) at a particular time, to avoid tri-state driver contention. FIG. 2 is not limiting in any way; other devices and/or circuits may be used in place of tri-state drivers and MUXs to accomplish consistent or similar logical functions.

Figure 3:
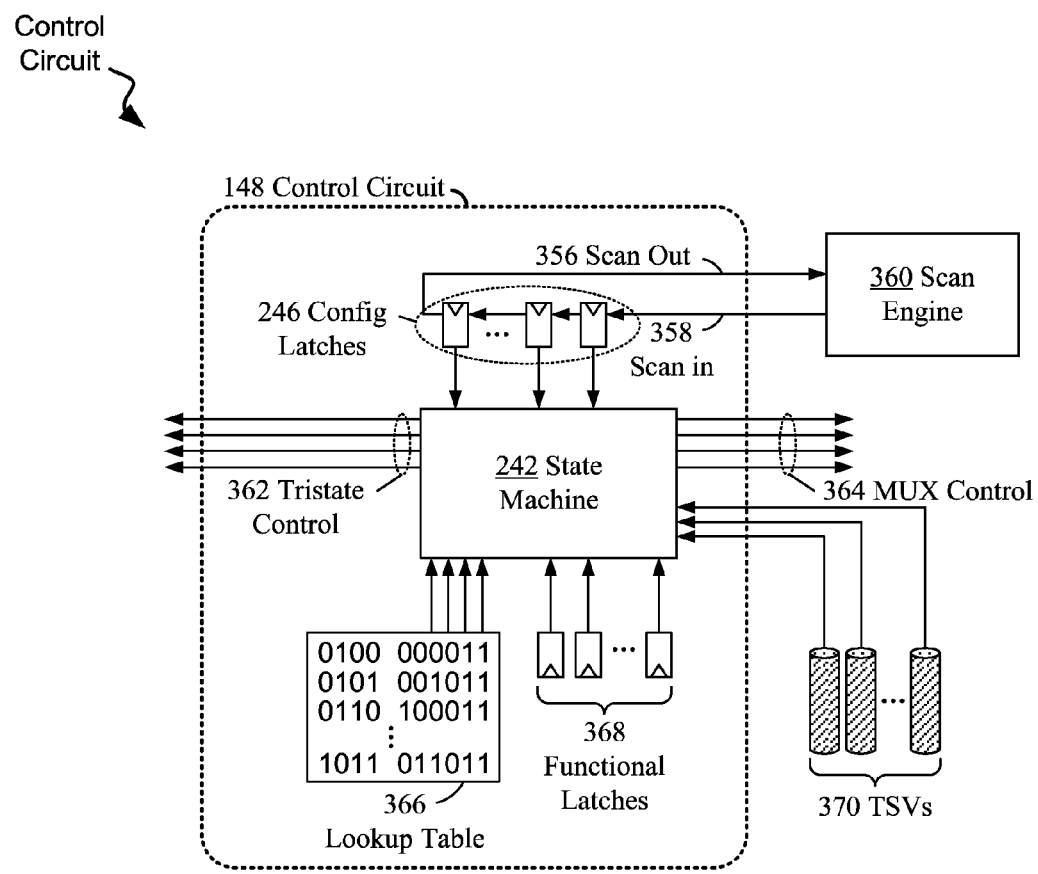
FIG. 3 is a block diagram of a control circuit including a state machine, configuration latches, functional latches and a lookup table, according to embodiments.

FIG. 3 is a block diagram of a control circuit 148 including a state machine 242, configuration latches 246, functional latches 368 and a lookup table 366, according to embodiments consistent with FIG. 1, 2. FIG. 3 may be useful in depicting how the state machine 242 may be configured, in a variety of ways, through hardware and software, with both initial and updated configuration data.

At least one of the configuration latches 246 may include a serial scan latch that is configured to be written to and read from by a scan engine 360. In certain embodiments, configuration latches 246 maybe scannable, through scan input 358 and scan output 356, by scan engine 360, which may be located outside of the control circuit 148. Scan engine 360 be used in conjunction with other scan engines and/or connections on control circuits of other TSVADs.

Control circuit 148 may include a lookup table 366 configured to contain configuration data that is accessible by state machine 242. Lookup table 366 may include electrically erasable programmable read-only memory (EEPROM), flash or other types of nonvolatile memory devices, or may include volatile memory which may be accessed by an electronic device used to manage or configure the 3-D IC.

In certain embodiments, control circuit 148 may include at least one functional latch 368 which may be accessible by the state machine 242. Data in functional latches 368 may represent a current state of a processor circuit or state machine on a chip of the 3-D IC. Example states of a processor circuit, for example, may include states such as "running", "idle", "debug", "diagnostic", or one of several configurations for the processor or other on-chip circuit. Data contained in functional latches 368 may be used by the state machine 242 to establish or alter the connections of a switching circuit, (e.g., 108, FIG. 2) in response to the current state of the processor circuit.

Tri-state control signals 362, generated by state machine 242, may be consistent with tri-state control signals 134, FIG. 2. MUX control signals 364, generated by state machine 242, may be consistent with MUX control signals 124, 140, 144, FIG. 2.

TSVs 370 may be directly connected to state machine 244, and may be used to transmit logical signals from another chip of the 3-D IC, or from an electronic device used to manage and/or configure one or more TSVADs of the 3-D IC. Logical signals received on TSVs 370 may be static ("hardwired") or dynamic, depending on the circuit or electronic device that is used to assert them. In certain embodiments, TSVs 370 may be useful for transmitting signals to a number of chips within a 3-D IC.

Figure 4:
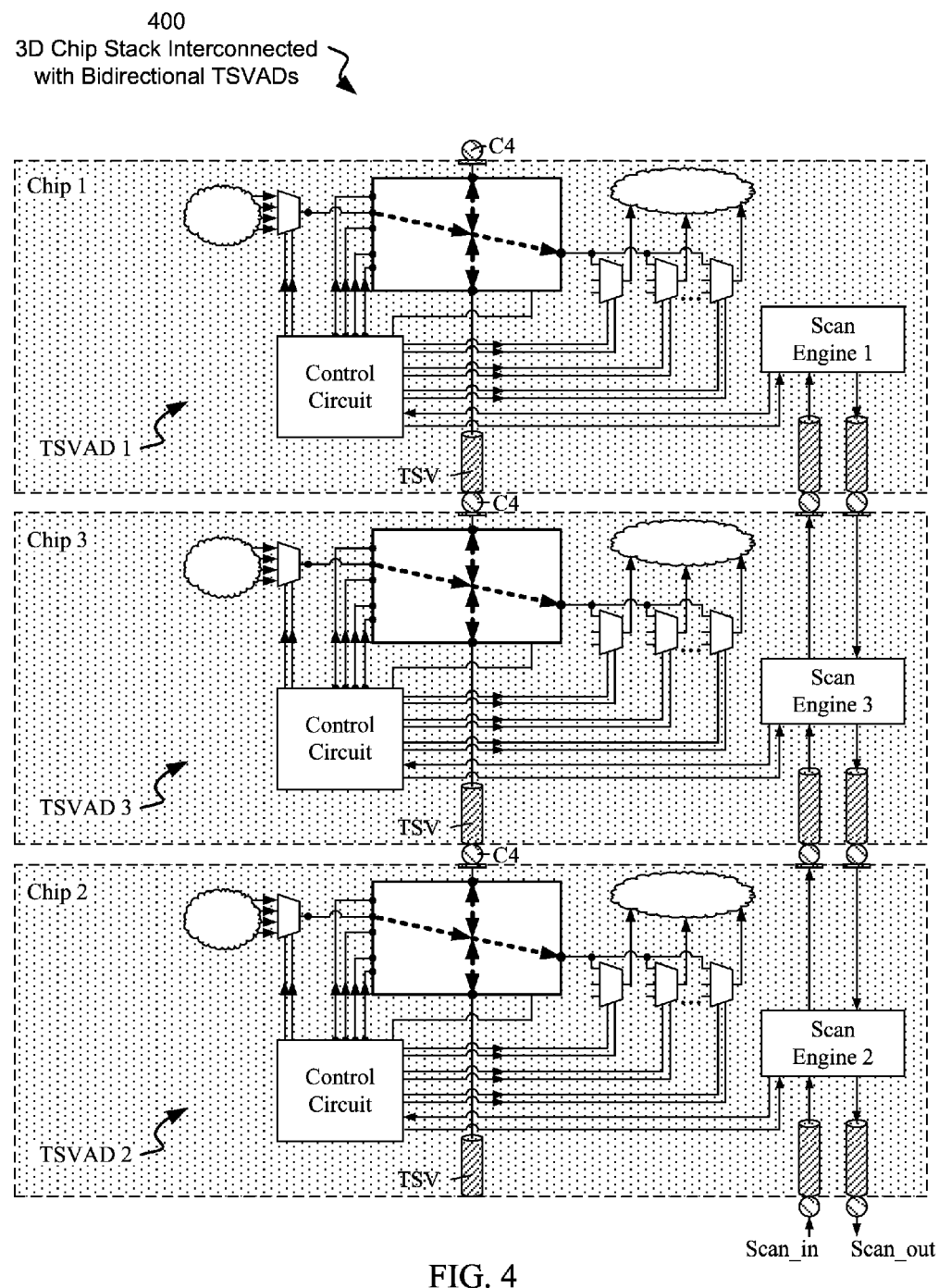
FIG. 4 is a block diagram of a stack of three chips, each chip having a TSVAD and interconnected through through-silicon vias (TSVs), according to embodiments.

FIG. 4 is a block diagram 400 of a stack of three semiconductor chips, Chip 1, Chip 2 and Chip 3, each chip having TSVADs TSVAD 1, TSVAD 2, and TSVAD 3, respectively, and interconnected through TSVs and C4s, according to embodiments consistent with the figures. FIG. 4 may depict the physical arrangement and electrical interconnection of three chips in a planar stack within a 3-D IC, according to embodiments. The three semiconductor chips, Chip 1, Chip 2 and Chip 3 maybe interconnected through TSV terminals, each electrically coupled to a TSV that extends to a back face of its respective chip, and conductive pad terminals, each electrically coupled to a conductive pad on or adjacent to the front face of its respective chip. A TSV of one chip may be electrically connected to conductive pad located on a front face of an adjacent chip. Each of the three chips may have a TSVAD coupled to an on-chip logic circuit, to a TSV, and to a conductive pad. FIG. 4 depicts three chips in a planar stack, however certain embodiments may include two chips, while certain embodiments may include four or more chips in a planar stack, within the 3-D IC. In certain embodiments the topmost chip in a planar stack (e.g., Chip 1) may include one or more C4s attached to conductive pads on the topmost surface of the chip, and in certain embodiments the topmost chip (e.g., Chip 1) may not have C4s attached to conductive pads on the topmost surface of the chip.

A scan chain including Scan Engine 1, Scan Engine 2 and Scan Engine 3, interconnected by TSVs and C4s, may be useful in setting initial control parameters within each TSVAD's control circuit, and in changing control parameters during operation of the 3-D IC. The scan chain may be useful in setting or changing control parameters within the TSVADs, in a coordinated fashion, to establish specified interconnections between chips of the 3-D IC. The scan chain may receive serial data into a Scan_in input, and drive serial data onto a Scan_out output. The Scan_in input and Scan_out output may be connected to another chip, or an external hardware device configured to manage and modify control parameters of the 3-D IC.

A plurality of interconnections between at least two semiconductor chips may be established by controlling, using a set of control signals, logical devices (e.g., tri-state drivers and MUXs) in the switching circuit of each TSVAD. The plurality of interconnections may include additional TSVs and conductive pads.

A variety of configurations and connections between Chip 1, Chip 2 and Chip 3 are possible by varying configuration data in the TSVADs TSVAD 1, TSVAD 2, and TSVAD 3. For example, in certain embodiments, signals may be driven by a chip lower in the chip stack (e.g., chip 2) upwards to chips higher in the chip stack (e.g., chip 1, 3). In certain embodiments signals may be driven downwards in the chip stack, or from a chip located between two others (e.g., chip 3) both upwards and downwards to other chips.

Various embodiments may include TSVAD configurations to support bidirectional, unidirectional and multi-drop topologies between two or more chips within the 3-D IC. A bidirectional net may support signal transfers originating from one of two drivers, at different points in time, whereas a unidirectional net may support a single direction of signal transfer from one driver to one receiver. A multi-drop net may include one or more drivers and several receivers, on various chips, configured to receive data on the net.

In certain embodiments, the TSVAD of a particular chip may be configured to block the transfer of signals received from a certain direction (e.g., downward) to other chips and in certain embodiments the TSVAD may be configured to transfer signals received from a certain direction to other chips in that direction. Certain embodiments may be configured to allow signal transfers in either direction (e.g., upwards or downwards).

In certain embodiments the TSVAD of a chip may be configured to allow a logical value from a sending logic circuit (e.g., 114, FIG. 1) to be driven onto at least one of the conductive pad (e.g., 104, FIG. 2) and the TSV (e.g., 150, FIG. 2) of the chip. In certain embodiments the TSVAD of the chip may be configured to allow a logical value from at least one of the conductive pad (e.g., 104, FIG. 2) and the TSV (e.g., 150, FIG. 2) of the chip to be received by a receiving logic circuit (e.g., 120, FIG. 1).

The configurations described above may be combined in a variety of ways in order to meet the needs of a particular application.

Figure 5:
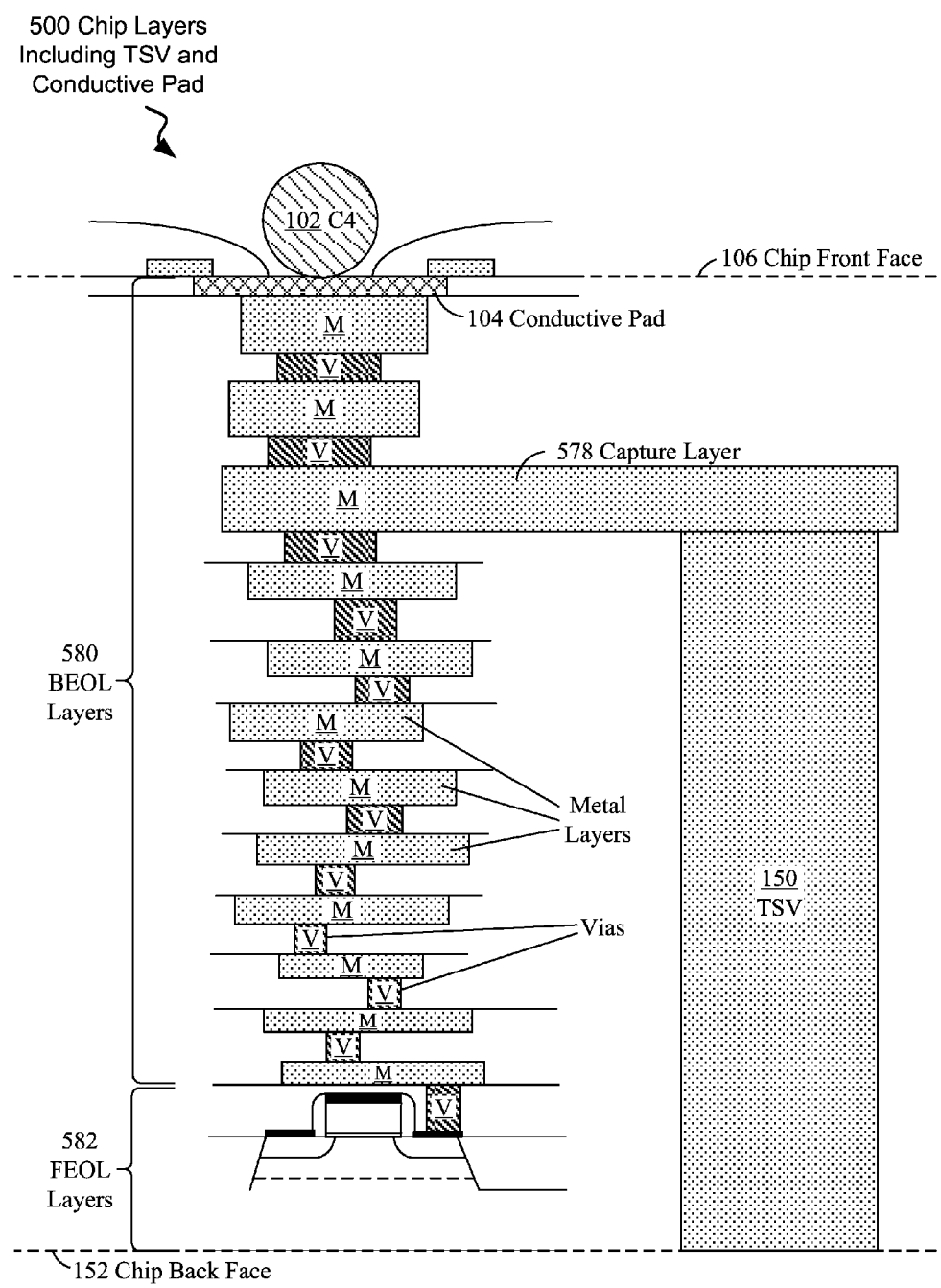
FIG. 5 depicts a cross-sectional view of a semiconductor chip, including active layers, metal layers, via layers and a TSV, according to embodiments.

FIG. 5 depicts a cross-sectional view 500 of layers of a semiconductor chip, including active front-end-of-line (FEOL) layers 582, metal back-end-of-line (BEOL) layers 580 including via layers "V" and metal layers "M", a TSV 150, and a capture layer 578, according to embodiments consistent with the figures. FIG. 5 may be useful for illustrating placement, structure and interconnection of active devices, conductive layers, TSVs and conductive pads of chips within a 3-D IC.

Process steps to create FEOL layers 582 may be the first portion of a fabrication process sequence which may include creation of individual electronic devices such as transistors, capacitors and resistors, on a semiconductor substrate. FEOL process steps may generally include all integrated circuit (IC) fabrication steps up to (but not including) the deposition of metal interconnect layers.

FEOL process steps may include all fabrication operations used to form, for example, isolated complementary metal-oxide semiconductor (CMOS) devices such as P-channel field-effect transistors (PFETs) and N-channel field-effect transistors (NFETs). FEOL steps may also be used to produce "deep trench" devices such as capacitors used in dynamic random-access memory (DRAM) devices. FEOL layers may be located above a back face 152 of a semiconductor chip, and may be separated from the back face 152 by bulk semiconductor material and/or and oxide layer.

Process steps to create back-end-of-line (BEOL) layers 580 may be the second portion of an IC fabrication process which may include interconnection, by wiring (e.g., metal layers "M" and via layers "V") individual devices (e.g., transistors, capacitors and resistors) on a semiconductor substrate. BEOL process steps may generally begin with deposition of a first metal layer on the semiconductor substrate. BEOL steps may include forming contacts, insulating layers (dielectrics), metal levels "M", via structures "V" and conductive pads 104. A BEOL process may be used to add ten or more metal layers which may interconnect electronic devices on the semiconductor substrate.

Conductive pads 104 may be used as attachment sites for controlled collapse chip connections (C4s) which may be used to physically and electrically connect a semiconductor chip to another semiconductor chip, the electronic package, a printed circuit board, or other electronic device. The conductive pad 104 may be located at the front face 106 of the semiconductor chip.

A TSV 150 may be formed within the semiconductor chip, and may extend from the chip back face 152 to a capture layer 578, which may be electrically connected to other metal and/or via layers, including conductive pad 104, within the BEOL layers 580. TSV fabrication steps may be performed during and in conjunction with FEOL process steps and/or BEOL process steps.

The capture layer 578 may be any metal layer of the semiconductor chip. The vertical location of capture layer 578 may include any metallization layer "M" between, and including, the first metal layer (adjacent to and above the active devices in the FEOL layers 582), to the conductive pad 104 layer, at the chip front face 106. In embodiments, the vertical location of capture layer 578 may depend on semiconductor fabrication processes, and/or a particular fabrication stage at which an engineering change order (ECO) is received and implemented. The TSV 150 may be useful for establishing an electrical connection from the chip back face 152, through the FEOL layers, to the capture layer. The capture layer may be useful for extending the electrical connection of the TSV into a range of BEOL metal layers 580. In certain embodiments, a TSV 150 may extend from the chip back face 152 to a metallization layer "M". In certain embodiments, a TSV 106 may extend from the chip back face 152 to the conductive pad 104.

Figure 6:
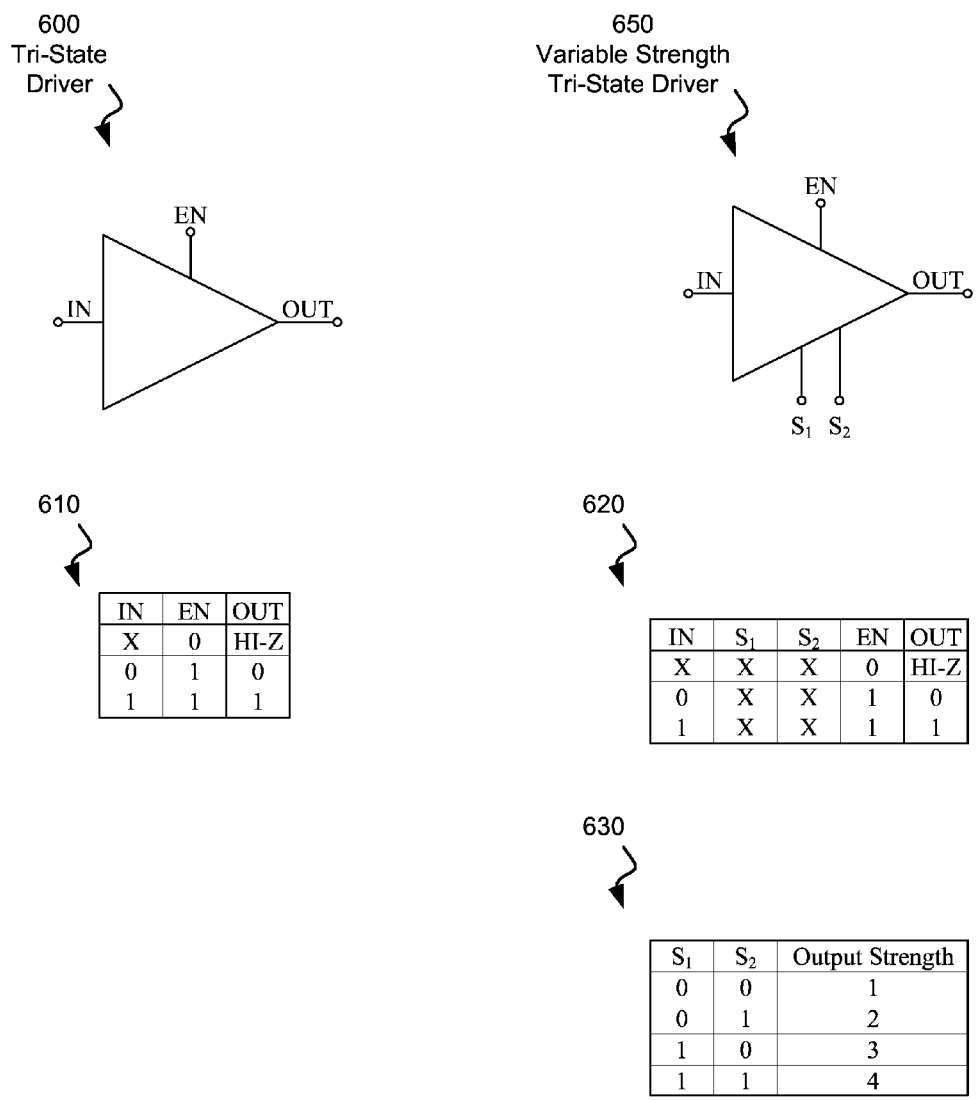
FIG. 6 includes logic symbols and truth tables for a tri-state driver and a variable-strength tri-state driver, according to embodiments.

FIG. 6 includes logic symbol 600 and truth table 610 for a tri-state driver, and logic symbol 650 and truth tables 620, 630 for a variable-strength tri-state driver, according to embodiments consistent with the figures.

In certain applications, tri-state driver 600 may be useful in driving, in response to an input applied to an IN terminal and an enable terminal EN driven to a logical "1" value, in output terminal OUT with a copy of the logical signal applied to the IN terminal. Truth table 610 depicts these logical relationships. In certain embodiments a signal driven on the OUT terminal may have the same polarity as the signal applied to the IN terminal, and in certain embodiments the signal driven on the OUT terminal may have an inverted polarity from the signal applied to the IN terminal.

In certain applications, a first tri-state driver 600 may be disabled by asserting a logic "0" value on the EN terminal. Disabling a first tri-state driver 600 may be useful in avoiding contention with a second tri-state driver that has its OUT terminal electrically connected to the OUT terminal of the first tri-state driver (e.g., 210, 226, FIG. 2).

In certain embodiments, a variable-strength tri-state driver 650 may be used in place of a tri-state driver 600. Variable-strength tri-state driver 650 may have a drive strength control inputs $S_1$ and $S_2$, which may be useful in controlling an impedance or current drive capability of driver 650. Controlling the drive strength of a tri-state driver 650 may be useful for adjusting the impedance or current drive capability of the driver for a variety of driver loading conditions.

For example, in certain applications, a variable-strength tri-state driver 650 may be connected to a "lightly" loaded TSV that is connected to one receiving circuit within a single chip of the 3-D IC. In another application, the variable-strength tri-state driver 650 may be connected to a more "heavily" loaded TSV that is connected to several receiving circuits within several chips of the 3-D IC. A load to be driven by a tri-state driver may be specified, for example, by a length of interconnect, a number of receiver circuits, and/or a capacitive loading attached to the driver's output. Controlling the strength of a tri-state driver 650 may allow the driver to be used in several applications having different loads connected to the driver output.

Truth table 620 depicts logical relationships between variable-strength tri-state driver 650 input IN, enable EN, and output OUT that are consistent with relationships depicted in truth table 610. Drive strength control inputs $S_1$ and $S_2$ may be useful in controlling the driver output strength, but may have no effect on the logical value of the output, and are therefore listed interest table 620 as "X" or "don't care".

Truth table 630 depicts the relationship between the logical values of $S_1$ and $S_2$ and the resulting output strength of driver 650. Combinations of the logical values of the $S_1$ and $S_2$ inputs may yield a range of driver output strengths (e.g., 1-4). The drive strengths "1-4" may represent, for example, maximum current drives in mA, in certain embodiments. In certain embodiments, drive strengths "1-4" may be replaced by a range of output impedances, for example, 40Ω, 45Ω, 50Ω and 55Ω, or other numerical indications of maximum current drive or driver impedance.

Logical symbol 650 and truth tables 620, 630 depict a variable-strength tri-state driver having two driver strength control inputs, however this is not limiting. Certain embodiments may have one driver strength control input, and certain embodiments may have several driver strength control inputs, depending on a specified granularity and/or range of driver strength control for a particular application. Driver strength control input values (e.g., on $S_1$ and $S_2$ input terminals) may be generated by a control circuit (e.g., 148 FIG. 1) connected to one or more variable-strength tri-state drivers.

Figure 7:
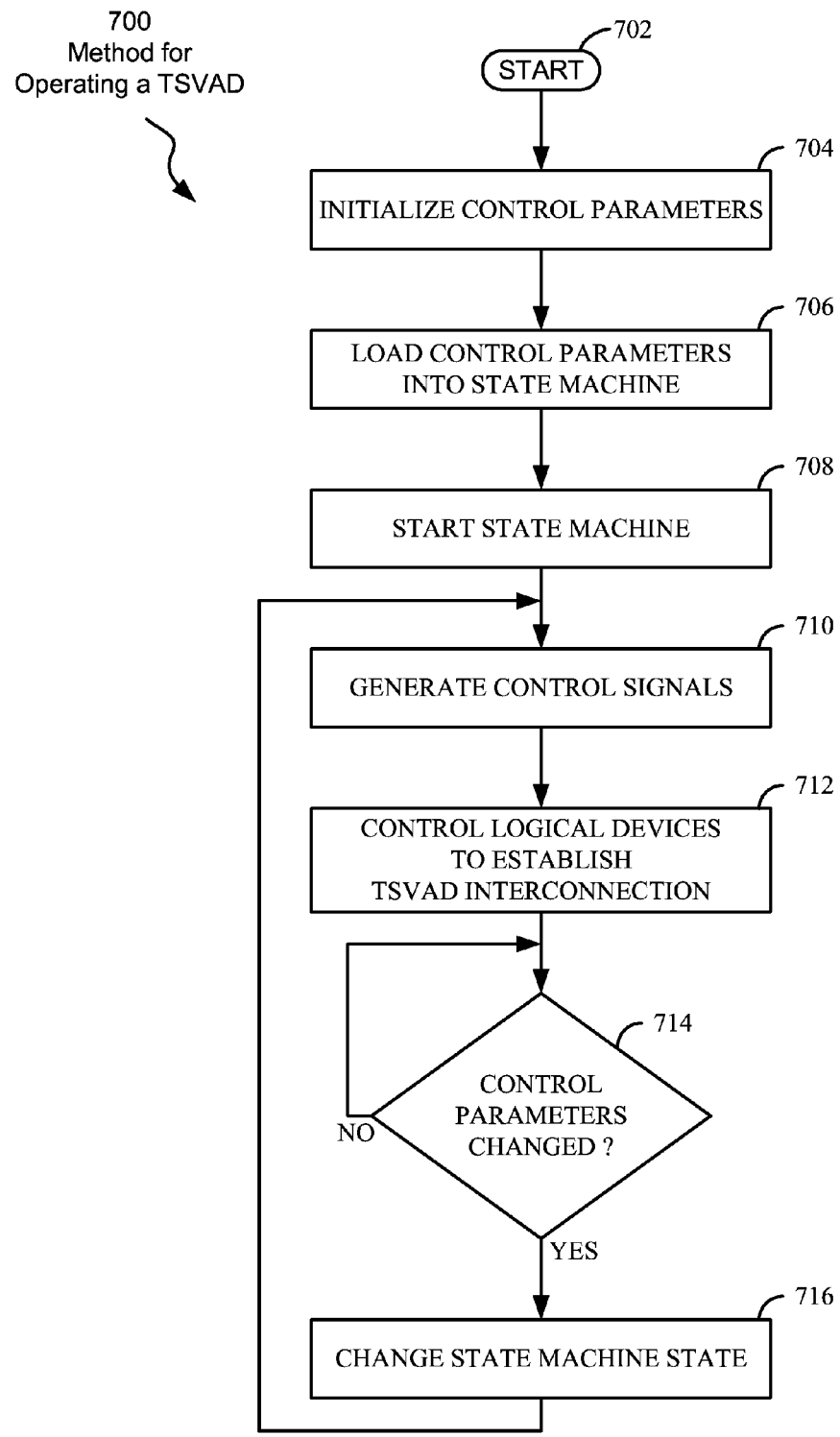
FIG. 7 is a flow diagram illustrating a method for operating a TSVAD, according to embodiments.

FIG. 7 is a flow diagram illustrating a method for operating a TSVAD 700 to establish an electrical interconnection between at least two semiconductor chips located in a planar stack of semiconductor chips, according to embodiments consistent with the figures. The method for operating a TSVAD 700 may be useful for dynamically configuring a TSVAD to establish interconnections between inputs from logic, outputs to logic, a TSV and a conductive pad. The process 700 moves from start 702 to operation 704.

Operation 704 generally refers to the initialization of TSVAD control parameters used by a control circuit (e.g., 148, FIG. 1). In certain embodiments, the TSVAD control parameters may be initialized by an external system or supervisory hardware. In certain embodiments, TSVAD parameters may be hardwired, through TSV connections to a control circuit (e.g., 370, FIG. 3) or written to a lookup table (e.g., 366, FIG. 3). Once TSVAD control parameters are initialized, the process moves to operation 706.

Operation 706 generally refers to loading the initialized set of control parameters into a state machine (e.g., 242, FIG. 2), for example, within a control circuit (e.g., 148, FIG. 2) of the TSVAD. Initialized set of control parameters may be loaded into one or more registers or latches within the state machine (e.g., 242, FIG. 2), where they may be accessed and/or modified by the state machine. Once the initialized set of control parameters is loaded into the state machine, the process moves to operation 708.

Operation 708 generally refers to starting the state machine. Once started, the state machine may respond to inputs or changing state values by changing internal state values and generating updated control outputs. Once the state machine is started, the process moves to operation 710.

Operation 710 generally refers to generating, in response to the set of control parameters, a set of control signals. In certain applications, the set of control parameters may be the set initialized in operation 704, and in certain applications, the set of control parameters may be the set of control parameters changed in operation 714. A modified set of control signals may be generated in response to the changed state of the state machine. Once the set of control parameters is generated, the process moves to operation 712.

Operation 712 generally refers to controlling, using the set of control signals, logical devices to establish an electrical interconnection that includes a first TSV and a conductive pad, between at least two TSVADs in at least two semiconductor chips. In certain applications, the set of control signals may be modified, in response to a changed state of the state machine (operation 716), from the initialized set of control signals. The set of control signals may be connected to, and used to control, logical devices within a switching circuit (e.g., 108, FIG. 2) such as tri-state drivers and MUXs. Once the electrical interconnection is established, the process moves to decision 714.

At decision 714, a determination is made regarding whether control parameters have changed from a previous set of control parameters. If the control parameters have changed since the previous set of control parameters the process moves to operation 716. If the control parameters have not changed since the previous set of control parameters, the process returns to decision 714.

Operation 716 generally refers to changing, in response to a change of the control parameters, the state of a state machine. The logical state of the state machine may correlate to logical values held with latches or registers within the state machine. Once state of the state machine is changed, the process returns to operation 710.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of operating through-silicon via access devices (TSVADs) to establish an electrical interconnection between at least two semiconductor chips located in a planar stack of semiconductor chips, the method comprising:

initializing a set of control parameters used by a control circuit;

loading the initialized set of control parameters into a state machine;

generating, in response to the initialized set of control parameters, a set of control signals;

controlling, using the set of control signals, logical devices to establish a first electrical interconnection that includes a first through-silicon via (TSV) and a first conductive pad, between at least two TSVADs in the at least two semiconductor chips;

changing, in response to a change of the control parameters, a state of the state machine;

generating, in response to the changed state of the state machine, a modified set of control signals; and modifying, using the modified set of control signals, the electrical interconnection between the at least two TSVADs in the at least two semiconductor chips, wherein the state machine is configured to generate the set of control signals based on configuration data accessible by the state machine and held in a serial scan latch configured to be written to and read from by a scan engine coupled to the state machine.

2. The method of claim 1, wherein modifying the electrical interconnection between the at least two TSVADs in at least two semiconductor chips includes changing a signal propagation direction between a first TSVAD and a second TSVAD.

3. The method of claim 1, wherein controlling, using the set of control signals, logical devices, further comprises establishing a second electrical interconnection that includes a second through-silicon via (TSV) and a second conductive pad, between the at least two semiconductor chips.

4. The method of claim 1, wherein the control circuit further comprises a lookup table configured to contain configuration data that is accessible by the state machine.

5. The method of claim 1, wherein the control circuit further comprises at least one functional latch, accessible by the state machine, that is configured to represent a state of a processor circuit on the chip.

6. The method of claim 1, wherein the control circuit further comprises at least one configuration TSV configured to provide a configuration pattern to the state machine.

* * * * *